US009831271B2

(12) United States Patent
Tamaru

(10) Patent No.: US 9,831,271 B2
(45) Date of Patent: *Nov. 28, 2017

(54) SEMICONDUCTOR DEVICE

(71) Applicant: Socionext Inc., Kanagawa (JP)

(72) Inventor: Masaki Tamaru, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/204,723

(22) Filed: Jul. 7, 2016

(65) Prior Publication Data

US 2016/0322383 A1 Nov. 3, 2016

Related U.S. Application Data

(63) Continuation of application No. 14/754,174, filed on Jun. 29, 2015, now Pat. No. 9,412,757, which is a
(Continued)

(30) Foreign Application Priority Data

Oct. 26, 2010 (JP) .................................. 2010-239997

(51) Int. Cl.
*H01L 27/118* (2006.01)
*H01L 21/768* (2006.01)
(Continued)

(52) U.S. Cl.
CPC .. *H01L 27/11807* (2013.01); *H01L 21/76895* (2013.01); *H01L 23/485* (2013.01);
(Continued)

(58) Field of Classification Search
CPC . H01L 2027/11829; H01L 2027/11861; H01L 2027/11866
(Continued)

(56) References Cited

U.S. PATENT DOCUMENTS 5,241,207 A 8/1993 Toyoshima et al.
5,355,023 A 10/1994 Tomioka et al.
(Continued)

FOREIGN PATENT DOCUMENTS

EP 0317133 B1 9/1993
JP 58-116760 A 7/1983
(Continued)

OTHER PUBLICATIONS

International Search Report dated Oct. 11, 2011 issued in corresponding International Application No. PCT/JP2011/004147.
(Continued)

*Primary Examiner* — Olik Chaudhuri
*Assistant Examiner* — Wilner Jean Baptiste
(74) *Attorney, Agent, or Firm* — McDermott Will & Emery LLP

(57) ABSTRACT

A local interconnect is formed in contact with an upper surface of an impurity diffusion region and extends to below a potential supply interconnect. A contact hole electrically couples the local interconnect to the potential supply interconnect. The local interconnect, which is formed in contact with the upper surface of the impurity diffusion region, is used for electrically coupling the impurity diffusion region to the potential supply interconnect.

18 Claims, 12 Drawing Sheets

Related U.S. Application Data continuation of application No. 13/659,229, filed on Oct. 24, 2012, now Pat. No. 9,099,447, which is a continuation of application No. PCT/JP2011/004147, filed on Jul. 22, 2011.

(51) Int. Cl.

| | | |
|---|---|---|
| *H01L 27/02* | (2006.01) | |
| *H01L 23/485* | (2006.01) | |
| *H01L 29/10* | (2006.01) | |

(52) U.S. Cl.
CPC ...... *H01L 27/0207* (2013.01); *H01L 29/1079* (2013.01); *H01L 2027/11829* (2013.01); *H01L 2027/11861* (2013.01); *H01L 2027/11866* (2013.01); *H01L 2027/11875* (2013.01); *H01L 2924/0002* (2013.01)

(58) Field of Classification Search
USPC .................................................. 257/390, 369
See application file for complete search history.

(56) References Cited

U.S. PATENT DOCUMENTS

| | | | |
|---|---|---|---|
| 5,677,249 A | 10/1997 | Fukui et al. | |
| 6,617,621 B1 | 9/2003 | Gheewala et al. | |
| 7,475,375 B2 | 1/2009 | Nakanishi | |
| 2003/0116819 A1 | 6/2003 | Hokazono | |
| 2005/0077550 A1 | 4/2005 | Inaba et al. | |
| 2005/0087806 A1 | 4/2005 | Hokazono | |
| 2005/0116303 A1* | 6/2005 | Takahashi | H01L 21/84 257/384 |
| 2006/0065933 A1 | 3/2006 | Chu et al. | |
| 2006/0181309 A1 | 8/2006 | Nakanishi | |
| 2006/0202231 A1 | 9/2006 | Yamamoto | |
| 2007/0033548 A1 | 2/2007 | Tatsumi | |
| 2007/0096154 A1* | 5/2007 | Shimbo | H01L 27/0207 257/207 |
| 2007/0228419 A1 | 10/2007 | Komaki | |
| 2007/0300202 A1* | 12/2007 | Uchida | H01L 27/0207 716/116 |
| 2009/0014811 A1* | 1/2009 | Becker | H01L 27/0207 257/390 |
| 2009/0026503 A1 | 1/2009 | Tsuda | |
| 2009/0026546 A1 | 1/2009 | Shimada et al. | |
| 2010/0269081 A1* | 10/2010 | Hou | G06F 17/5068 716/123 |
| 2012/0280287 A1 | 11/2012 | Hou et al. | |

FOREIGN PATENT DOCUMENTS

| | | |
|---|---|---|
| JP | 58-202553 A | 11/1983 |
| JP | 05-067738 A | 3/1993 |
| JP | 2000-031286 A | 1/2000 |
| JP | 2008-004790 A | 1/2008 |

OTHER PUBLICATIONS

Partial English translation of Chinese Office Action issued in Chinese Application No 201180021812.9 dated Aug. 11, 2014.
Office Action issued in U.S. Appl. No. 13/659,229, dated Nov. 18, 2013.
Final Office Action issued in U.S. Appl. No. 13/659,229, dated May 22, 2014.
Final Office Action issued in U.S. Appl. No. 13/659,229, dated Sep. 2, 2014.
Office Action issued in U.S. Appl. No. 13/659,229, dated Dec. 18, 2014.
Notice of Allowance issued in U.S. Appl. No. 13/659,229, dated Mar. 31, 2015.
U.S. Office Action issued in U.S. Appl. No. 14/754,174 dated Dec. 18, 2015.
U.S. Notice of Allowance issued in U.S. Appl. No. 14/754,174, dated Apr. 8, 2016.

* cited by examiner

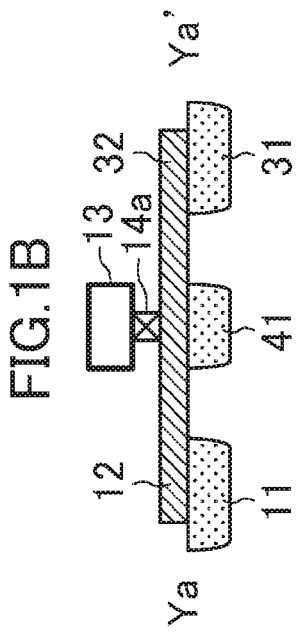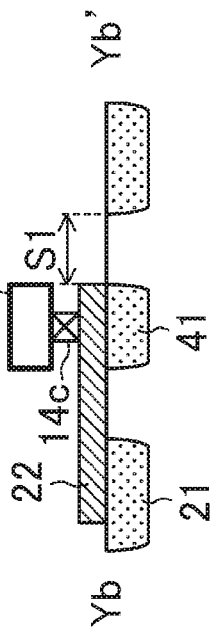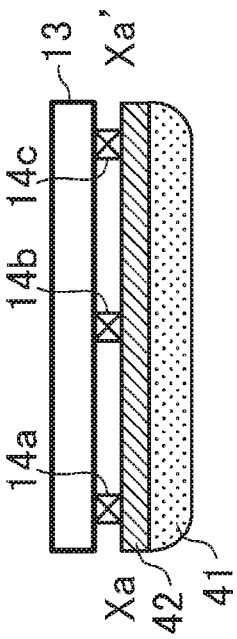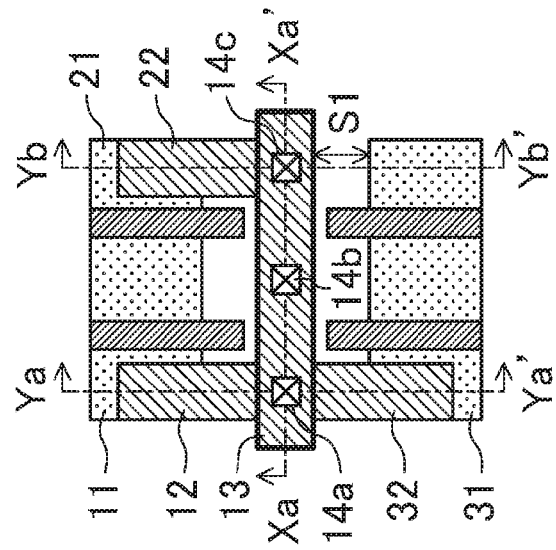

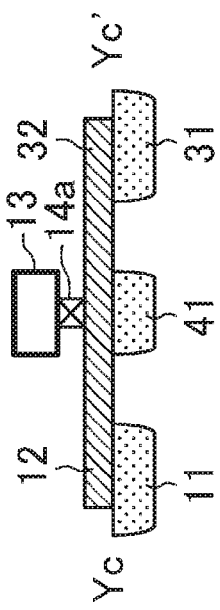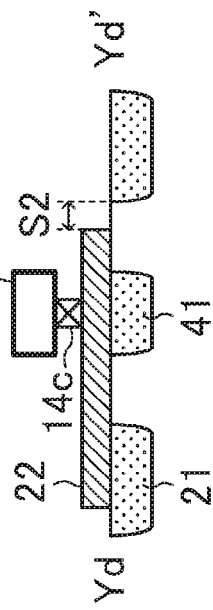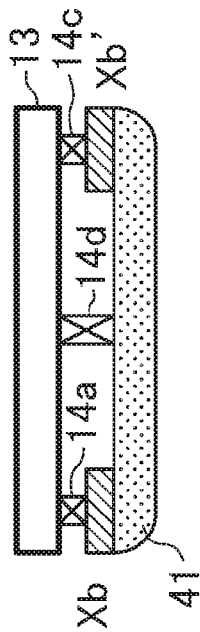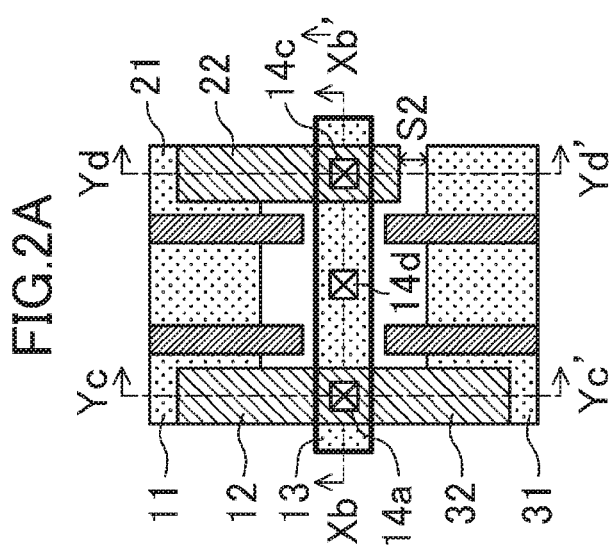

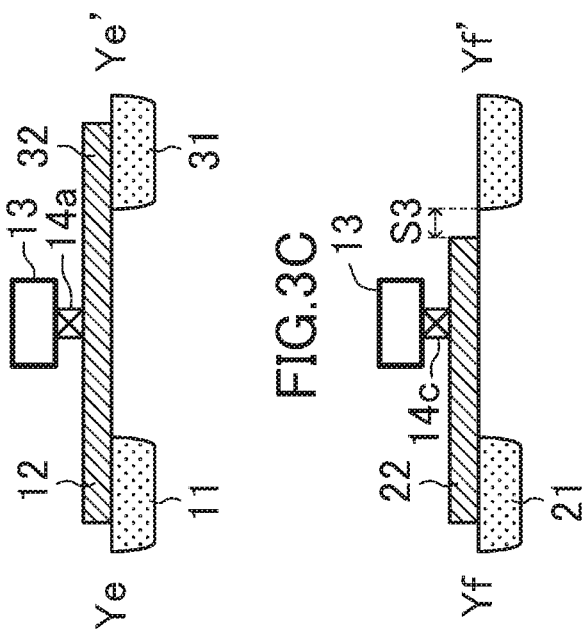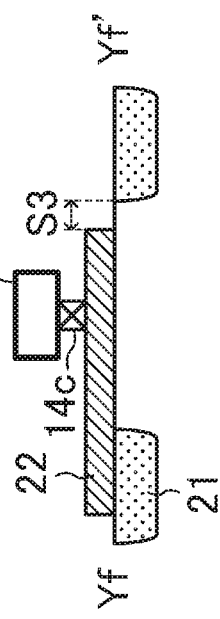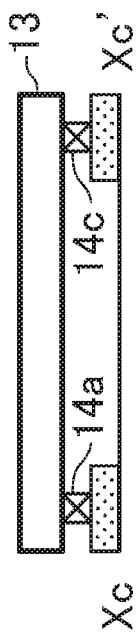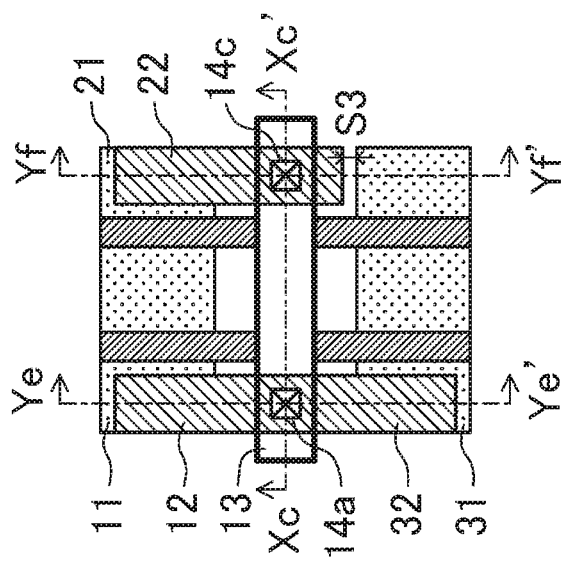

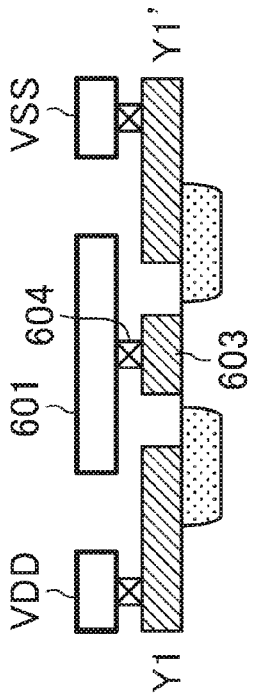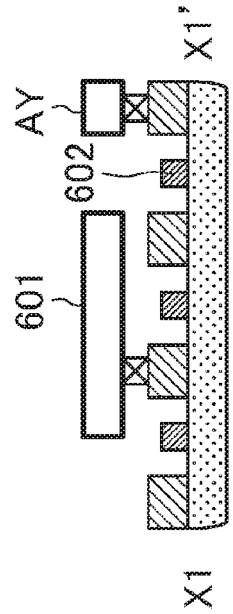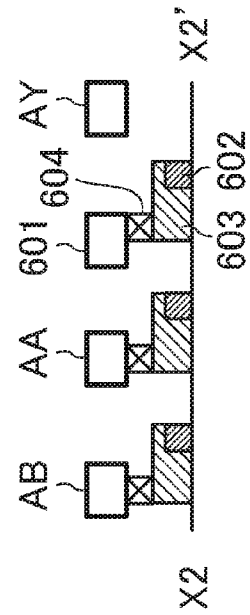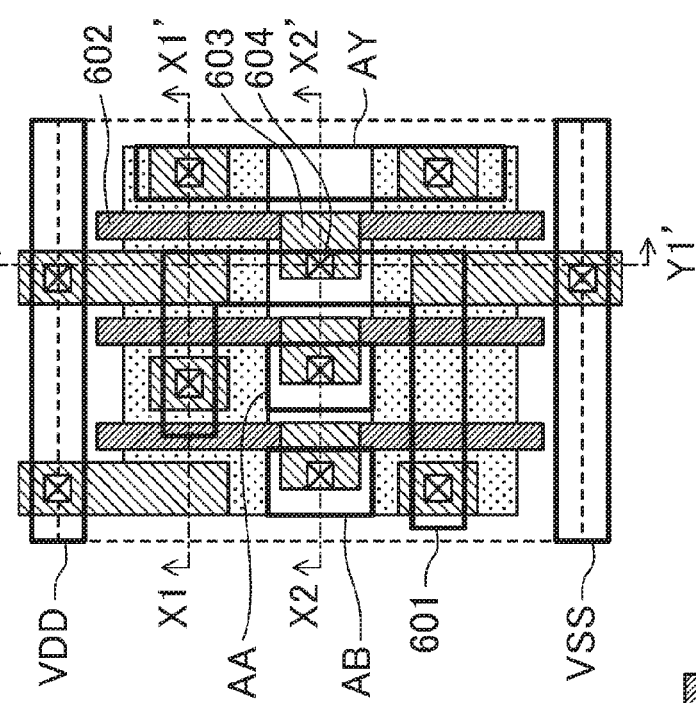

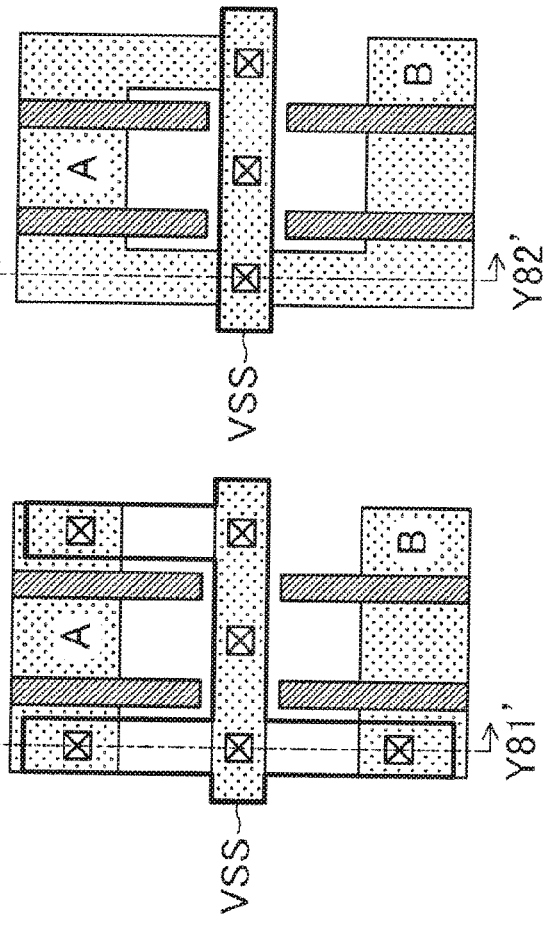
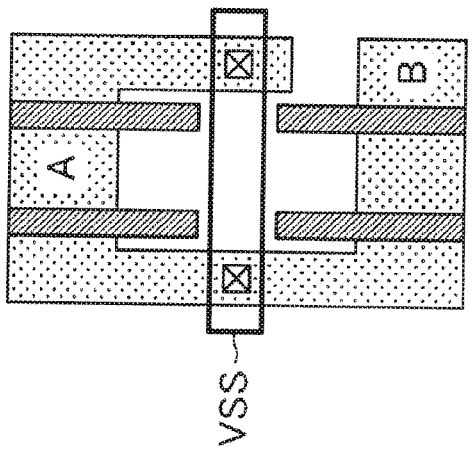
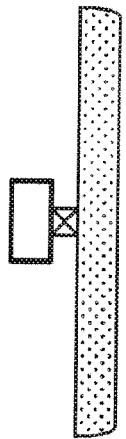
FIG.8A  FIG.8B  FIG.8C  FIG.8D  FIG.8E
GATE ELECTRODE
IMPURITY DIFFUSION REGION
CONTACT HOLE
POTENTIAL SUPPLY INTERCONNECT

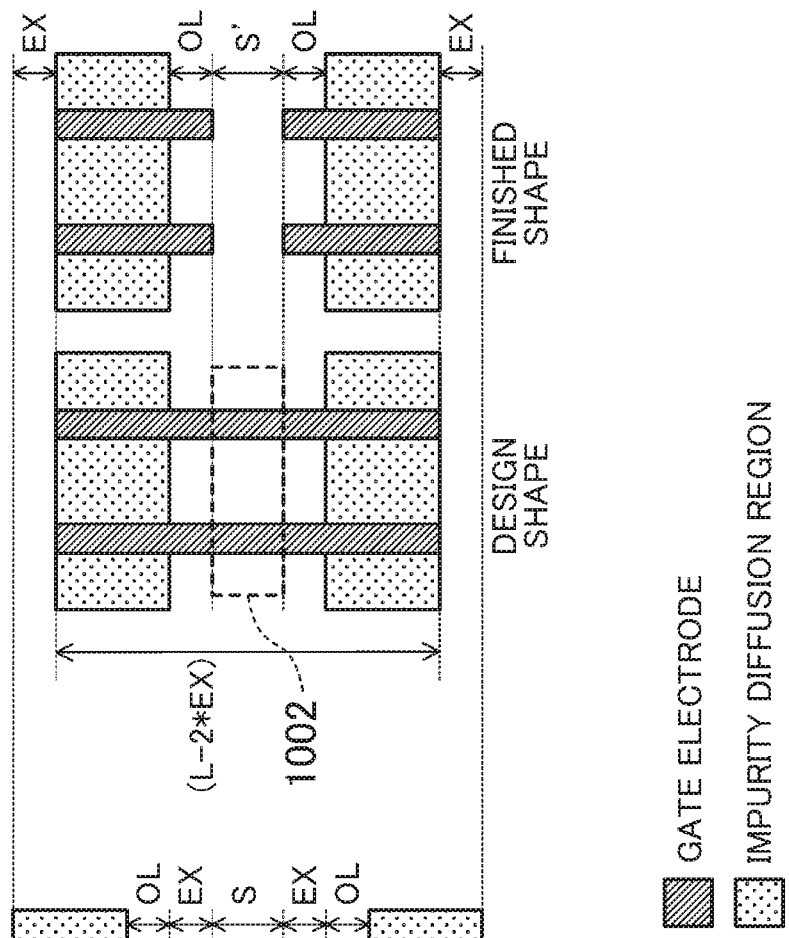

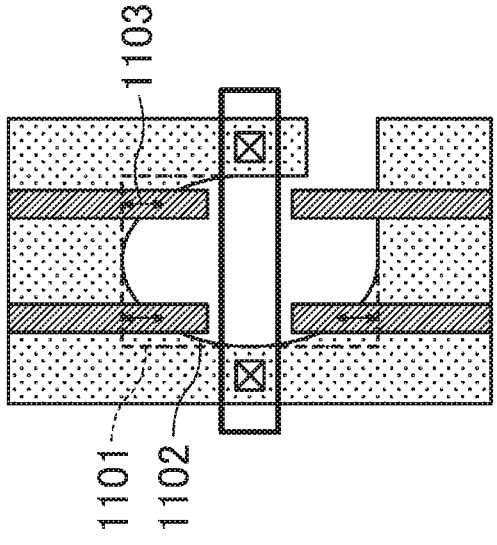
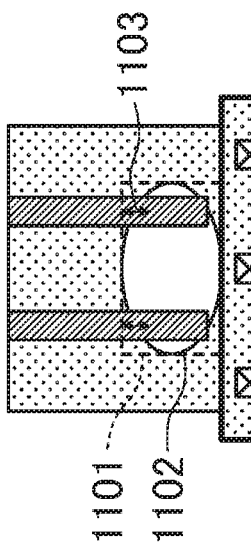

▨ GATE ELECTRODE
░ IMPURITY DIFFUSION REGION
⊠ CONTACT HOLE
☐ POTENTIAL SUPPLY INTERCONNECT

SEMICONDUCTOR DEVICE

CROSS-REFERENCE TO RELATED APPLICATION

This application is a continuation of U.S. application Ser. No. 14/754,174, filed on Jun. 29, 2015, now U.S. Pat. No. 9,412,757, which is a continuation of U.S. application Ser. No. 13/659,229 filed on Oct. 24, 2012, now U.S. Pat. No. 9,099,447, which is a continuation of PCT International Application PCT/JP2011/004147 filed on Jul. 22, 2011, which claims priority to Japanese Patent Application No. 2010-239997 filed on Oct. 26, 2010. The disclosures of these applications including the specifications, the drawings, and the claims are hereby incorporated by reference in their entirety.

BACKGROUND

The present disclosure relates to semiconductor devices, and more particularly to semiconductor devices providing higher-speed operation and higher integration.

In a conventional semiconductor device, a source region of each transistor formed by an impurity diffusion layer extends to a boundary between standard cells to be coupled to a power supply interconnect shared by standard cell rows, thereby securing an interconnect resource in a standard cell and reducing the area of the standard cell.

FIGS. 8A-8E illustrate an example configuration of a conventional semiconductor device. FIGS. 8A-8C are layout top views. FIG. 8D is a cross-sectional view taken along the line Y81-Y81' of FIG. 8A. FIG. 8E is a cross-sectional view taken along the line Y82-Y82' of FIG. 8B. A circuit diagram of FIG. 9 is implemented by the configuration shown in FIGS. 8A-8E. In FIG. 9, two NMOS transistors 901 are coupled in parallel between a power supply interconnect VSS and a terminal A. Two NMOS transistors 902 are coupled in series between the power supply interconnect VSS and a terminal B. In FIGS. 8A-8C, two transistors above the power supply interconnect VSS in the drawing correspond to the NMOS transistors 901, and two transistors below the power supply interconnect VSS in the drawing correspond to the NMOS transistors 902.

In FIG. 8A, potential is supplied from the power supply interconnect VSS, which is provided around the boundary between adjacent transistors, to the source region of each transistor via a potential supply interconnect and a contact hole. Thus, impurity diffusion regions and contact holes are provided immediately below the power supply interconnect VSS to reinforce the power supply interconnect VSS.

In FIG. 8B, the source region of each transistor is extracted to immediately below the power supply interconnect VSS, which is provided around the boundary between adjacent transistors and a contact hole is provided, thereby supplying potential to the source regions of the transistors. An impurity diffusion region and contact holes are provided immediately below the power supply interconnect VSS to reinforce the power supply interconnect VSS.

FIG. 8C illustrates a variation of the configuration of FIG. 8B. An impurity diffusion region and contact holes are provided immediately below the power supply interconnect VSS only in the portion where the source region of each transistor extends to the power supply interconnect VSS.

Contrary to the configuration of FIG. 8A, there is no need to use an interconnect region from the power supply interconnect VSS to the source region of each transistor in FIGS. 8B and 8C. This measure is advantageous in reducing the chip area, since the interconnect resource critical in reducing the height of a standard cell can be effectively used. While the potential supply interconnect extending from the source region of each transistor is a metal interconnect in FIG. 8A, the potential supply interconnect is an impurity diffusion region in FIGS. 8B and 8C. Since a metal interconnect resource is not used, the area can be reduced.

As miniaturization in a semiconductor manufacturing process progresses, a technique of accurately processing a gate electrode by repeating exposure and etching a plurality of times in patterning the gate electrode has been used. Advantages in repeating exposure and etching (a complex process) in patterning a gate electrode will be described below with reference to FIGS. 10A and 10B.

FIGS. 10A and 10B illustrate a difference between a design shape and a finished shape of the pattern of a gate electrode where the pattern is formed by a conventional single process. FIG. 10A is a layout illustrating the design shape of impurity diffusion regions and gate electrodes forming the source/drains of transistors. The terminals of the gate electrodes of upper and lower transistors in the drawing, which protrude from the impurity diffusion regions, face each other.

FIG. 10B illustrates the actual finished shape of the gate electrodes of the layout of the design shape in FIG. 10A. In the drawing, OL is the protruding amount of each gate electrode to prevent shorting of a source region and a drain region even if the masks of the gate electrodes and the impurity diffusion regions are misaligned. EX is the receding amount of the thin line pattern in patterning the gate electrodes. S is the separating interval to prevent shorting in the layer. L is the length required for obtaining a desired transistor width in FIGS. 10A and 10B.

On the other hand, FIGS. 10C and 10D illustrate a difference between a design shape and a finished shape of the pattern of a gate electrode where the pattern is formed by a complex process. FIG. 10C is a layout illustrating the design shape of impurity diffusion regions and gate electrodes forming the source/drains of transistors. The terminals of the gate electrodes of upper and lower transistors in the drawing, which protrude from the impurity diffusion regions, are coupled to each other. A recognition layer 1002 for removing the gate electrodes in a subsequent step is provided in the region coupled to the gate electrodes of the upper and lower transistors in the drawing.

FIG. 10D illustrates the actual finished shape of the gate electrodes of the layout of the design shape in FIG. 10C. In the actual finished shape, the gate electrodes of the upper and lower transistors in the drawing are separated. In the drawing, OL is the protruding amount of the each gate electrode to prevent shorting of a source region and a drain region even if the masks of the gate electrodes and the impurity diffusion regions are misaligned. S' is the distance separated in removing the gate electrodes. EX is the receding amount of the thin line pattern in patterning the gate electrodes. EX is required in the single process and a margin not required in FIG. 10D. Therefore, EX corresponds to reduction in the size in the vertical direction of the drawing.

As shown in FIGS. 10A-10D, where the gate electrodes are patterned by the single process, the length L is required in the vertical direction of the drawing. On the other hand, where the gate electrodes are patterned by the complex process, only the length of (L−2×EX) is required for forming transistors providing the same performance. As such, the chip area can be reduced.

Japanese Patent Publication No. 2008-4790 (page 11, FIG. 3) is cited for reference.

SUMMARY

However, the conventional semiconductor device has the following problems.

FIGS. 11A and 11B illustrate the actual finished shape of an impurity diffusion region in the layout of FIGS. 8B and 8C. Reference numeral 1101 denotes the design shape of an opening region of the impurity diffusion region. Reference numeral 1102 denotes the actual finished shape of the impurity diffusion region. Reference numeral 1103 denotes a difference in the transistor width between the design shape and the actual finished shape.

Where the source region of the transistor is designed to extend to immediately below the power supply interconnect as shown in FIGS. 8B and 8C, the actual finished shape 1102 of the impurity diffusion region is as shown in FIGS. 11A and 11B due to rounding. This causes a difference 1103 in the transistor width between the design shape 1101 and the actual finished shape 1102, thereby causing a malfunction in the circuit. That is, in the conventional semiconductor device, the rounding of the impurity diffusion region increases variations in the characteristics of the transistors.

FIGS. 12A and 12B illustrate the actual finished shape of the impurity diffusion region in the layout of FIGS. 8B and 8C, where the gate electrodes shown in FIGS. 10C and 10D are patterned by a complex process. Reference numeral 1201 denotes the design shape of an opening region of the impurity diffusion region. Reference numeral 1202 denotes the actual finished shape of the impurity diffusion region. Reference numeral 1203 denotes the separation of the opening region of the impurity diffusion region in the design shape.

As shown in FIGS. 12A and 12B, by patterning the gate electrodes by the complex process, the separation 1203 of the opening region of the impurity diffusion region is extremely small. Thus, the actual finished shape 1202 of the impurity diffusion region is as shown in the drawings due to rounding. This causes a difference in the transistor width between the design shape 1201 and the actual finished shape 1202, thereby causing a malfunction in the circuit, and a problem in the circuit due to the shorting of the sources and drains of the transistors. That is, in the conventional semiconductor device, where the gate electrodes are patterned by the complex process, variations in the characteristics of the transistors are increased by rounding of the impurity diffusion region, and a problem occurs in processing of the impurity diffusion region.

Where the separation 1203 of the opening region of the impurity diffusion region is increased to avoid the problems, the objective of reducing the area of the chip by reducing the height in the layout cannot be achieved.

In view of the problems, it is an objective of the present disclosure to reduce the area of a semiconductor device, without causing variations in the characteristics of transistors and a malfunction in the circuit due to rounding of an impurity diffusion region.

A semiconductor device according to an aspect of the present disclosure includes a first impurity diffusion region formed on a substrate; a potential supply interconnect formed in an interconnect layer above the first impurity diffusion region, and extending in a first direction; a first local interconnect formed in contact with an upper surface of the first impurity diffusion region, and extending to below the potential supply interconnect; and a first contact hole electrically coupling the first local interconnect to the potential supply interconnect.

According to this aspect, the first local interconnect is formed in contact with the upper surface of the first impurity diffusion region, and extends to below the potential supply interconnect. The first contact hole electrically couples the first local interconnect to the potential supply interconnect. That is, no metal interconnect resource is used for electrically coupling the impurity diffusion region to the potential supply interconnect. Instead, the local interconnect is used, which is formed in contact with the upper surface of the impurity diffusion region. Thus, the device is not influenced by rounding of the impurity diffusion region, thereby reducing the area.

According to the present disclosure, the local interconnect is formed in contact with the upper surface of the impurity diffusion region and is extracted to immediately below the potential supply interconnect. Therefore, the present disclosure reduces the area without causing a variation in the characteristics of transistors due to rounding of the impurity diffusion region.

BRIEF DESCRIPTION OF THE DRAWINGS

FIGS. 1A-1D illustrate an exemplary configuration of a semiconductor device according to a first embodiment. FIG. 1A is a top view. FIGS. 1B-1D are cross-sectional views.

FIGS. 2A-2D illustrate another exemplary configuration of a semiconductor device according to the first embodiment. FIG. 2A is a top view. FIGS. 2B-2D are cross-sectional views.

FIGS. 3A-3D illustrate still another exemplary configuration of a semiconductor device according to the first embodiment. FIG. 3A is a top view. FIGS. 3B-3D are cross-sectional views.

FIGS. 6A-6D illustrate a configuration of a semiconductor device according to a third embodiment. FIG. 6A is a top view. FIGS. 6B-6D are cross-sectional views.

FIGS. 8A-8E illustrates a configuration of a conventional semiconductor device. FIGS. 8A-8C are top views. FIGS. 8D and 8E are cross-sectional views.

FIGS. 10A-10D illustrate characteristics of gate patterning.

FIGS. 11A and 11B illustrate a difference between a design shape and a finished shape in a single process.

DETAILED DESCRIPTION

Embodiments of the present disclosure will be described hereinafter with reference to the drawings.

First Embodiment

Figure 9:
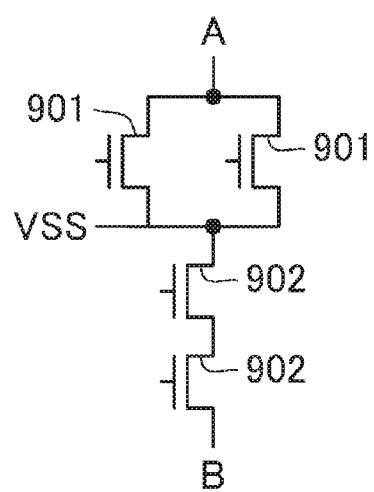
FIG. 9 is a circuit diagram of the semiconductor device of FIGS. 1A-3D and 8A-8E.

FIGS. 1A-1D illustrate an exemplary configuration of a semiconductor device according to a first embodiment. FIG. 1A is a layout top view. FIG. 1B is a cross-sectional view taken along the line Ya-Ya' of FIG. 1A. FIG. 1C is a cross-sectional view taken along the line Yb-Yb' of FIG. 1A. FIG. 1D is a cross-sectional view taken along the line Xa-Xa' of FIG. 1A. The circuit diagram of FIG. 9 is implemented by the configuration shown in FIGS. 1A-1D.

In FIGS. 1A-1D, impurity diffusion regions and gate electrodes, which form transistors, are formed on a substrate (not shown). A potential supply interconnect for supplying potential to the transistors is coupled to local interconnects by contact holes. The upper and lower transistors in the drawings share the potential supply interconnect. The local interconnect is provided immediately below the potential supply interconnect via the contact holes. Moreover, the impurity diffusion regions are provided immediately below and in contact with the local interconnect, thereby forming a triple-layer structure. The source region of each transistor is coupled to the potential supply interconnect by the local interconnect. Reference character S1 denotes the separation between the local interconnect and a drain formed by an impurity diffusion region included in a transistor.

Specifically, a potential supply interconnect 13, which extends in the horizontal direction (a first direction) of the drawing, is formed in an interconnect layer above the impurity diffusion region. A local interconnect 12, which is formed in contact with the upper surface of an impurity diffusion region 11, extends to below the potential supply interconnect 13. The potential supply interconnect 13 is electrically coupled to the local interconnect 12 by a contact hole 14a. Also, a local interconnect 22, which is formed in contact with the upper surface of an impurity diffusion region 21, extends to below the potential supply interconnect 13. The potential supply interconnect 13 is electrically coupled to the local interconnect 22 via a contact hole 14c. Furthermore, a local interconnect 32, which is formed in contact with the upper surface of an impurity diffusion region 31, extends to below the potential supply interconnect 13. The local interconnects 12 and 32 are integrally formed. The contact holes electrically coupling the local interconnects 12 and 32 to the potential supply interconnect 13 are used in common, and are integrally formed as the contact hole 14a.

A reinforcing impurity diffusion region 41 is formed on the substrate below the potential supply interconnect 13. A reinforcing local interconnect 42 is formed in contact with the upper surface of the reinforcing impurity diffusion region 41. The potential supply interconnect 13 is electrically coupled to the reinforcing local interconnect 42 via the contact holes 14a, 14b, and 14c. The contact holes 14a, 14b, and 14c are aligned in a straight line along the potential supply interconnect 13. The reinforcing local interconnect 42 and the local interconnects 12, 22, and 32 are integrally formed.

Figure 12A:
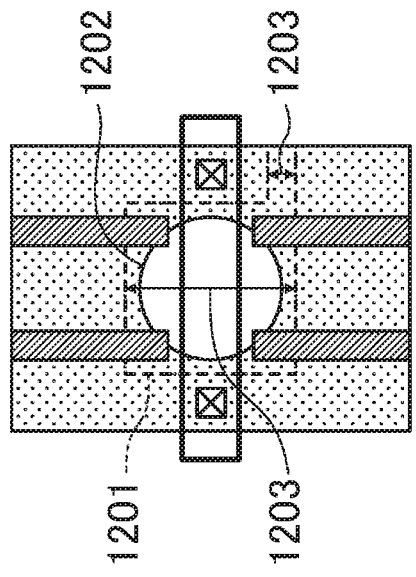
FIGS. 12A and 12B illustrate a difference between a design shape and a finished shape in a complex process.
Figure 12B:
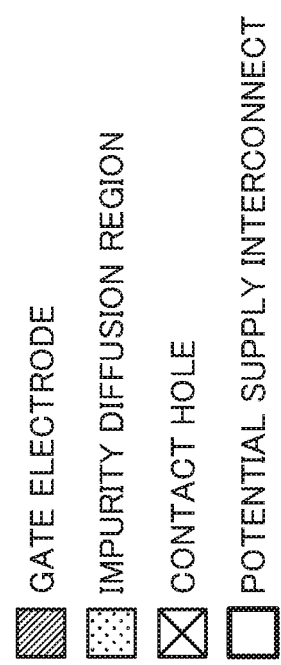

The local interconnects and the impurity diffusion regions forming the transistors are formed at different layers in a manufacturing process. The minimum value of the separation S1 mainly depends on the accuracy of alignment and is not influenced by variations in the size due to rounding. Therefore, the minimum value can be set much smaller than that of the separation 1203 of the impurity diffusion layer shown in FIG. 12A.

FIGS. 2A-2D illustrate another exemplary configuration of a semiconductor device according to this embodiment. The circuit diagram of FIG. 9 is also implemented by the configuration shown in FIGS. 2A-2D. FIG. 2A is a layout top view. FIG. 2B is a cross-sectional view taken along the line Yc-Yc' of FIG. 2A. FIG. 2C is a cross-sectional view taken along the line Yd-Yd' of FIG. 2A. FIG. 2D is a cross-sectional view taken along the line Xb-Xb' of FIG. 2A. The configuration in FIGS. 2A-2D is similar to that in FIGS. 1A-1D. In FIGS. 2A-2D, the same reference characters as those shown in FIGS. 1A-1D are used to represent equivalent elements, and the explanation thereof will be omitted.

In FIGS. 2A-2D, impurity diffusion regions and gate electrodes, which form transistors, are formed on a substrate (not shown). A potential supply interconnect for supplying potential to the transistors is coupled to local interconnects by contact holes. The upper and lower transistors in the drawings share the potential supply interconnect. Impurity diffusion regions are provided immediately below the potential supply interconnect. The source region of each transistor is coupled to an impurity diffusion region immediately below the potential supply interconnect by a local interconnect, and is coupled to the potential supply interconnect by the contact holes on the local interconnect. Reference character S2 denotes the separation between the local interconnect and a drain formed by the impurity diffusion region included in a transistor.

Different from FIGS. 1A-1D, no reinforcing local interconnect is provided below the potential supply interconnect 13. Thus, the potential supply interconnect 13 is directly coupled to the reinforcing impurity diffusion region 41 via a contact hole 14d without interposing a local interconnect even in a region immediately below the potential supply interconnect 13, in which no local interconnect is provided. The local interconnect 22, which is formed in contact with the upper surface of the impurity diffusion region 21, extends from below the potential supply interconnect 13 to a vacant space.

The local interconnects and the impurity diffusion regions forming the transistors are formed at different layers in a manufacturing process. The minimum value of the separation S2 mainly depends on the accuracy of alignment and is not influenced by variations in the size due to rounding. Therefore, the minimum value can be set much smaller than that of the separation 1203 of the impurity diffusion layer shown in FIG. 12A.

In FIGS. 2A-2D, a local interconnect, which is not directly coupled to the source region of a transistor, may be provided on the reinforcing impurity diffusion region 41, and a contact hole may be provided on the local interconnect to be coupled to the potential supply interconnect 13.

FIGS. 3A-3D illustrate still another exemplary configuration of a semiconductor device according to this embodiment. The circuit diagram of FIG. 9 is also implemented by the configuration shown in FIGS. 3A-3D, similar to FIGS. 1A-1D and 2A-2D. FIG. 3A is a layout top view. FIG. 3B is a cross-sectional view taken along the line Ye-Ye' of FIG. 3A. FIG. 3C is a cross-sectional view taken along the line Yf-Yf' of FIG. 3A. FIG. 3D is a cross-sectional view taken along the line Xc-Xc' of FIG. 3A. The configuration in FIGS. 3A-3D are similar to that in FIGS. 1A-1D. In FIGS. 3A-3D, the same reference characters as those shown in FIGS. 1A-1D are used to represent equivalent elements, and the explanation thereof will be omitted.

In FIGS. 3A-3D, impurity diffusion regions and gate electrodes, which form transistors, are formed on a substrate (not shown). A potential supply interconnect for supplying potential to the transistors is coupled to local interconnects by contact holes. The upper and lower transistors in the drawings share the potential supply interconnect. The source region of each transistor is coupled to the potential supply interconnect by the contact holes immediately below the potential supply interconnect. Reference character S3 denotes the separation between the local interconnect and a drain formed by an impurity diffusion region included in a transistor.

Different from FIGS. 1A-1D, no reinforcing local interconnect and no reinforcing impurity diffusion region are provided below the potential supply interconnect 13. The local interconnect 22, which is formed in contact with the upper surface of the impurity diffusion region 21, extends from below the potential supply interconnect 13 to a vacant space.

The local interconnects and the impurity diffusion regions forming the transistors are formed at different layers in a manufacturing process. The minimum value of the separation S3 mainly depends on the accuracy of alignment and is not influenced by variations in the size due to rounding. Therefore, the minimum value can be set much smaller than that of the separation 1203 of the impurity diffusion layer shown in FIG. 12A.

According to this embodiment, the local interconnects are formed in contact with the upper surfaces of the impurity diffusion regions and extracted to immediately below the potential supply interconnect. As a result, the area can be reduced without causing variations in the characteristics of the transistors due to rounding of the impurity diffusion regions.

Second Embodiment

Figure 4:
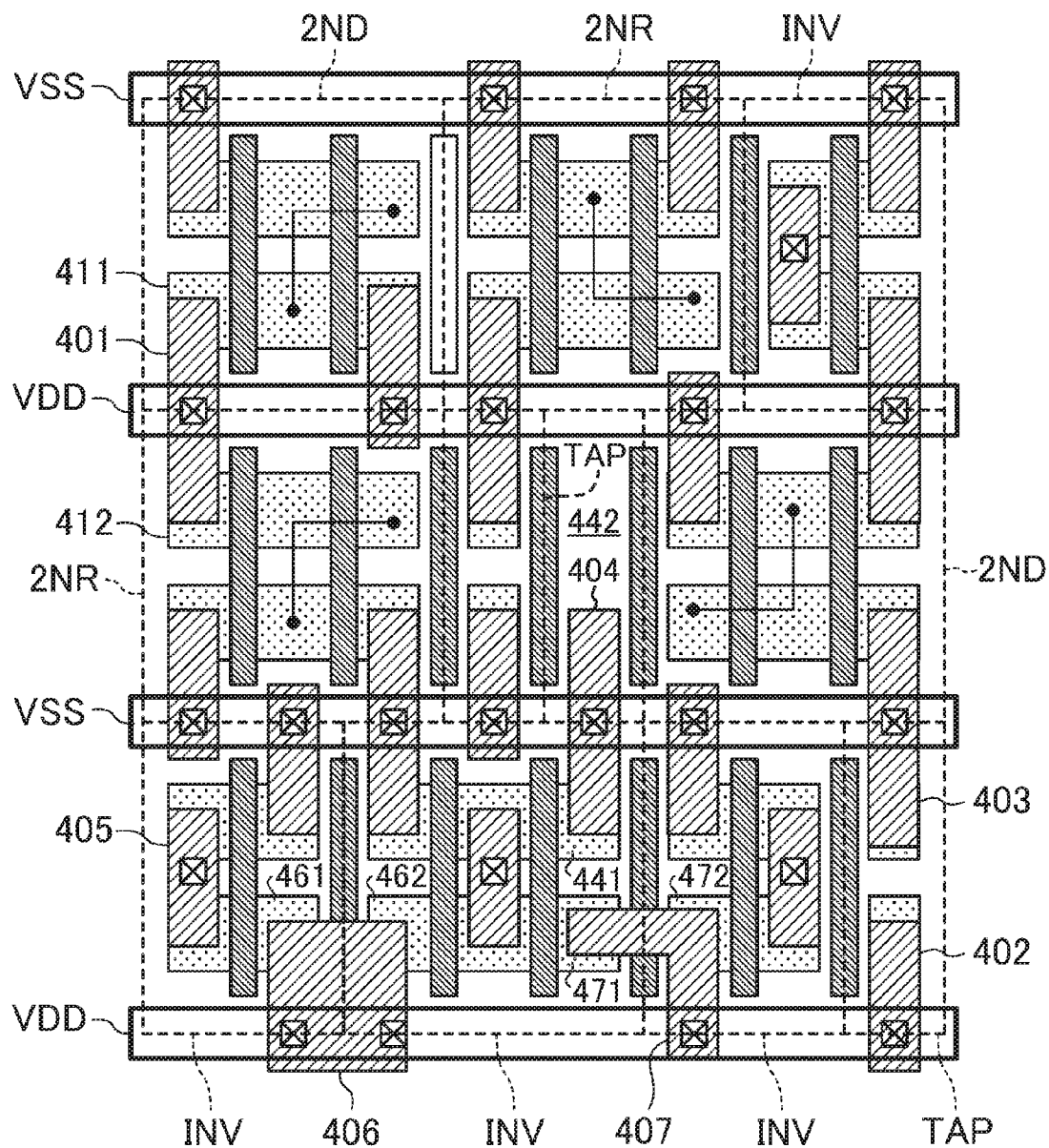
FIG. 4 is a top view illustrating a configuration of a semiconductor device according to a second embodiment.
Figure 5C:
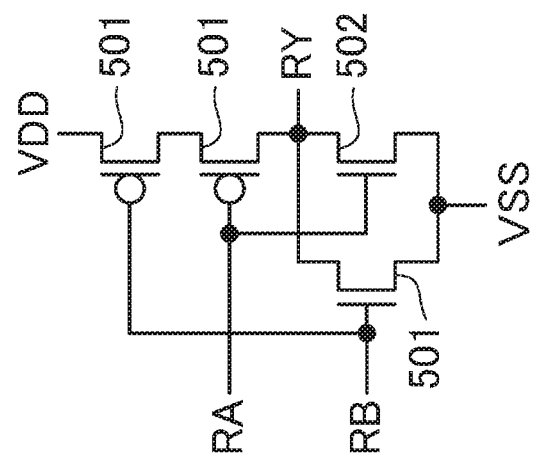
FIGS. 5A-5C are circuit diagrams of a standard cell forming the semiconductor device of FIG. 4.
Figure 5B:
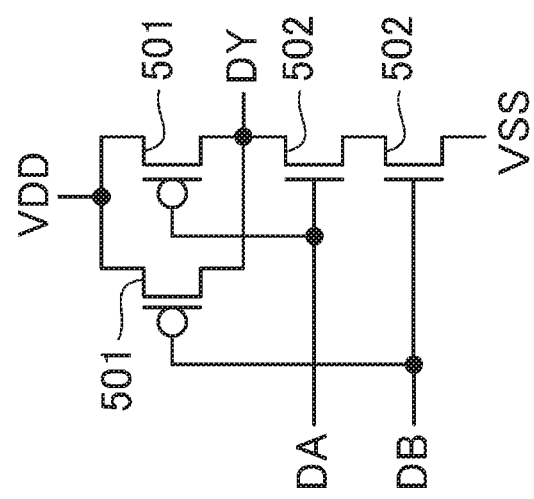
Figure 5A:
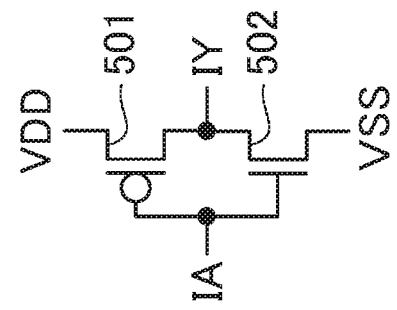

FIG. 4 is a layout top view illustrating a configuration of a semiconductor device according to a second embodiment. The semiconductor device of FIG. 4 is formed by standard cells which are the circuits shown in FIGS. 5A-5C. The circuit block is formed by arranging the standard cells in an array. In FIG. 4, INV denotes an inverter circuit cell, 2ND denotes a 2-input NAND circuit cell, 2NR denotes a 2-input NOR cell, and TAP denotes a cell supplying potential to a well or a substrate. FIG. 5A illustrates an inverter circuit. FIG. 5B illustrates a 2-input NAND circuit. FIG. 5C illustrates a 2-input NOR circuit. Reference numeral 501 denotes a PMOS transistor, and 502 denotes an NMOS transistor.

In FIG. 4, local interconnects as described in the first embodiment are formed, which are in contact with the upper surface of impurity diffusion regions and is extracted to immediately below the potential supply interconnect. For example, a local interconnect 401 couples source regions (impurity diffusion regions 411 and 412) of two transistors, which are provided in the vertical direction (a second direction) of the drawing with a potential supply interconnect VDD interposed therebetween, to the potential supply interconnect VDD. Specifically, the local interconnect 401 extends from the upper surface of the impurity diffusion region 411 via below the potential supply interconnect VDD to the upper surface of the impurity diffusion region 412. A local interconnect 404 extends from a source region (an impurity diffusion region 441) of a transistor and crosses over the potential supply interconnect VSS between standard cell columns to a vacant space 442 inside an adjacent standard cell column. Local interconnects 406 and 407 couple source regions (impurity diffusion regions 461 and 462 or 471 and 472) of two transistors, which are adjacent to each other in the horizontal direction (i.e., the first direction) of the drawing, to the potential supply interconnect VDD. The local interconnect 406 extends from the upper surface of the impurity diffusion region 461 to the upper surface of the impurity diffusion region 462. Reference numeral 402 denotes a local interconnect for supplying potential from the potential supply interconnect VDD to the well or the substrate. Reference numeral 403 denotes a local interconnect for supplying potential from the potential supply interconnect VSS to the well or the substrate. A local interconnect 405 couples a drain of an NMOS transistor to a drain of a PMOS transistor in a standard cell.

As shown in FIG. 4, the local interconnect 401 is shared by the upper and lower standard cells with the potential supply interconnect VDD interposed therebetween, and can be integrally formed. Similarly, the local interconnect 404 is shared by the upper and lower standard cells provided with the potential supply interconnect VSS interposed therebetween, and can be integrally formed. The local interconnect 406 is shared by the standard cells adjacent to each other in the horizontal direction, and can be integrally formed. With such configuration, the areas of the local interconnects can be secured above a certain level, thereby improving facility in the manufacturing.

Similar to the local interconnect 405, a local interconnect may couple a drain of an NMOS transistor to a drain of a PMOS transistor in a standard cell. Similar to the local interconnect 407, a local interconnect may be integrally formed to be coupled to the potential supply interconnect VDD via source regions of transistors adjacent in the horizontal direction of the drawing.

In FIG. 4, like the configuration shown in FIGS. 3A-3D, no reinforcing impurity diffusion region is provided immediately below the potential supply interconnect. However, as shown in FIG. 1A-1D, or 2A-2D, a reinforcing impurity diffusion region may be provided immediately below the potential supply interconnect.

According to this embodiment, the local interconnects are formed in contact with the upper surfaces of the impurity diffusion regions and extracted to immediately below the potential supply interconnect. As a result, the area can be reduced without causing variations in the characteristics of the transistors due to rounding of the impurity diffusion regions. Furthermore, the facility in manufacturing the local interconnects can be improved.

Third Embodiment

Figure 7:
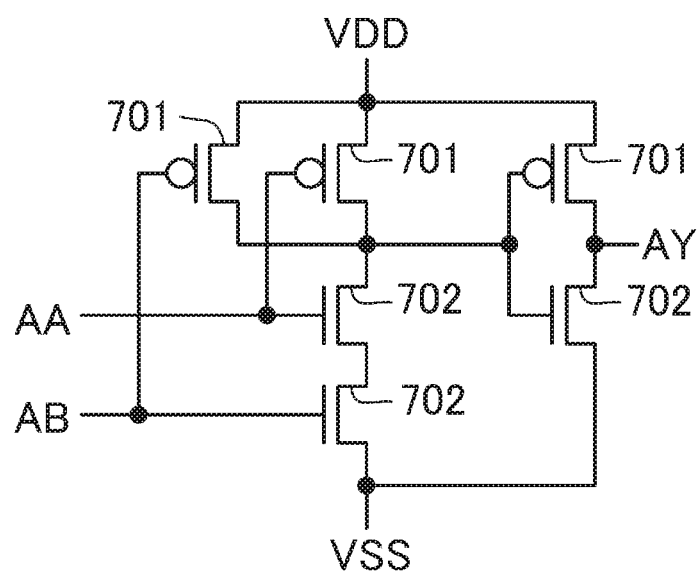
FIG. 7 is a circuit diagram of the semiconductor device of FIG. 6.

FIGS. 6A-6D illustrate a configuration of a semiconductor according to a third embodiment. FIG. 6A is a layout top view. FIG. 6B is a cross-sectional view taken along the line Y1-Y1' of FIG. 6A. FIG. 6C is a cross-sectional view taken along the line X1-X1' of FIG. 6A. FIG. 6D is a cross-sectional view taken along the line X2-X2' of FIG. 6A. The AND circuit shown in FIG. 7 is implemented by the configuration shown in FIG. 6A-6D. In FIG. 7, 701 denotes a PMOS transistor, 702 denotes an NMOS transistor, AA and AB denote input terminals, and AY denotes an output terminal.

In FIGS. 6A-6D, as described in the first and second embodiments, local interconnects are used in coupling potential supply interconnects VDD and VSS to source regions of transistors, the potential supply interconnects VDD and VSS to a substrate or a well, and a drain of a transistor to a drain of another transistor. Furthermore, in FIGS. 6A-6D, local interconnects are coupled to gate electrodes.

In FIGS. 6A-6D, 601 denotes an interconnect coupling an output of a 2-input NAND circuit and an input of an inverter circuit in an AND circuit. The interconnect 601 is formed in the same interconnect layer as the potential supply interconnects VDD and VSS. Reference numeral 602 denotes a gate electrode. Reference numeral 603 denotes a local interconnect formed in contact with the gate electrode 602. Reference numeral 604 denotes a contact hole electrically coupling the local interconnect 603 to the interconnect 601.

As shown in FIG. 6D, the input terminals AA and AB and the interelement interconnect 601 are coupled to gate electrodes via contact holes and local interconnects. An interconnect from the potential supply interconnects VDD and VSS to the source regions of the transistors does not interfere with the interelement interconnect 601, even if the height (in the vertical direction in the drawing) of standard cell is set low. This reduces interference between the interelement interconnect 601 and the interconnects coupled to the input terminals AA and AB and the output terminal AY, thereby reducing the area of the standard cell.

According to this embodiment, the local interconnects are formed in contact with the upper surfaces of the impurity diffusion regions, and extracted to immediately below the potential supply interconnect. As a result, the area can be reduced without causing variations in the characteristics of the transistors due to rounding of the impurity diffusion regions. Furthermore, the area can be further reduced using the local interconnects for the gate electrodes.

The semiconductor device according to the present disclosure is advantageous in reducing the margin of processing accuracy, alignment, etc. and thus is useful for increasing integration, reducing the area, and increasing speed and reliability, etc. of an LSI etc.

What is claimed is:

1. A semiconductor device comprising:
    a first standard cell comprising:
        a first source region; and
        a first isolation region surrounding the first source region or separating the first source region from another source region;
    a second standard cell comprising:
        a second source region; and
        a second isolation region surrounding the second source region or separating the second source region from another source region;
    a potential supply interconnect formed in an interconnect layer above the first source region and the second source region, and extending in a first direction;
    a local interconnect in contact with the first source region, the second source region, an upper surface of the first isolation region and an upper surface of the second isolation region, and disposed below the potential supply interconnect, the local interconnect extending in a second direction crossing the first direction; and
    at least one contact hole electrically coupling the local interconnect to the potential supply interconnect.

2. The semiconductor device of claim 1, wherein the first standard cell and the second standard cell are adjacent to each other in the first direction.

3. The semiconductor device of claim 1, wherein the first standard cell and the second standard cell are adjacent to each other in the second direction.

4. The semiconductor device of claim 3, wherein the local interconnect is shared by the first standard cell and the second standard cell.

5. The semiconductor device of claim 4, wherein the power supply interconnect is shared by the first standard cell and the second standard cell.

6. The semiconductor device of claim 1, further comprising
    a reinforcing impurity diffusion region formed in the substrate below the potential supply interconnect.

7. A semiconductor device comprising:
    a first standard cell comprising:
        a first source region; and
        a first isolation region surrounding the first source region or separating the first source region from another source region;
    a second standard cell comprising:
        a second source region; and
        a second isolation region surrounding the second source region or separating the second source region from another source region;
    a potential supply interconnect formed in an interconnect layer above the first source region and the second source region, and extending in a first direction;
    a local interconnect in contact with the first source region, the second source region, an upper surface of the first isolation region and an upper surface of the second isolation region, and disposed below the potential supply interconnect, the local interconnect extending in a second direction crossing the first direction, the local interconnect crossing the potential supply interconnect; and
    at least one contact hole electrically coupling the local interconnect to the potential supply interconnect.

8. The semiconductor device of claim 7, wherein the first standard cell and the second standard cell are adjacent to each other in the first direction with the supply interconnect interposed therebetween.

9. The semiconductor device of claim 7, wherein the first standard cell and the second standard cell are adjacent to each other in the second direction.

10. The semiconductor device of claim 9, wherein the local interconnect is shared by the first standard cell and the second standard cell.

11. The semiconductor device of claim 10, wherein the power supply interconnect is shared by the first standard cell and the second standard cell.

12. The semiconductor device of claim 7, further comprising
    a reinforcing impurity diffusion region formed in the substrate below the potential supply interconnect.

13. A semiconductor device comprising:
    a first standard cell comprising:
        a first source region; and
        a first isolation region surrounding the first source region or separating the first source region from another source region;
    a second standard cell comprising:
        a second source region; and
        a second isolation region surrounding the second source region or separating the second source region from another source region;
    a potential supply interconnect formed in an interconnect layer above the first source region and the second source region, and extending in a first direction;
    a local interconnect in contact with the first source region, the second source region, an upper surface of the first isolation region and an upper surface of the second isolation region, and disposed below the potential supply interconnect, the local interconnect extending in a second direction crossing the first direction; and
    at least one contact hole electrically coupling the local interconnect to the potential supply interconnect,
    wherein:
    the first standard cell is one of an inverter circuit cell, a NOR circuit cell and a NAND circuit cell, and the second standard cell is one of an inverter circuit cell, a NOR circuit cell and a NAND circuit cell.

14. The semiconductor device of claim 13, wherein the first standard cell and the second standard cell are adjacent to each other in the first direction.

15. The semiconductor device of claim 13, wherein the first standard cell and the second standard cell are adjacent to each other in the second direction.

16. The semiconductor device of claim 15, wherein the local interconnect is shared by the first standard cell and the second standard cell.

17. The semiconductor device of claim 16, wherein the power supply interconnect is shared by the first standard cell and the second standard cell.

18. The semiconductor device of claim 13, further comprising
a reinforcing impurity diffusion region formed in the substrate below the potential supply interconnect.

* * * * *